STABILIZED LOW FREQUENCY WAVE GENERATING CIRCUIT

Filed July 19, 1957

INVENTOR.
GEORGE T. ROYDEN
BY
ATTORNEY

United States Patent Office 2,938,171

Patented May 24, 1960

2,938,171

STABILIZED LOW FREQUENCY WAVE GENERATING CIRCUIT

George Taylor Royden, South Orange, N.J., assignor to Mackay Radio and Telegraph Company, Inc., New York, N.Y., a corporation of Delaware Filed July 19, 1957, Ser. No. 673,037

7 Claims. (Cl. 331—30)

This invention relates to stabilized electric wave generators and more particularly to systems for generating a highly stable electric current of low frequency. Such generators may be used for the control of the transmitting speed in synchronous telegraph systems comprising several relay stations and in many other applications where a very stable source of low frequency current is required.

It has already been proposed to derive such low frequency stabilized currents from a continuously operating oscillator which is frequency stabilized by a high precision oscillator, for example, of the piezo electric type by means of a suitable control network. A disadvantage of such systems is that failure of the high precision oscillator or any portion of the control network permits the output to continue unstabilized.

An object of the present invention is to provide a "fail safe" low frequency wave generating system in which the failure of any part of the system results in no output being obtained, thus ensuring no faulty operation and facilitating correction of any fault which may occur.

According to one feature of my invention an electric wave generator comprises a source of waves of stable frequency and a slave oscillator, waves derived from said source and from said slave oscillator being applied to a mixer device from which difference frequency waves are obtained, means being controlled by said difference frequency waves for applying to the slave oscillator bursts of pulses derived from the source of stable frequency waves, whereby several pulses of the slave oscillator are periodically made to coincide with pulses of the source of stable frequency waves. The potentials applied to the electrodes of a tube of the slave oscillator are so chosen that the slave oscillator circuit will not continue in oscillation in the absence of the applied bursts of pulses.

Figure 1:
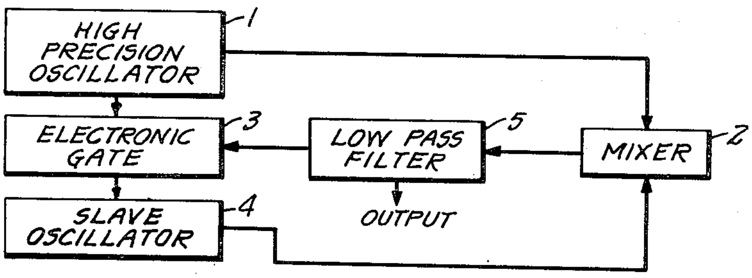
Figure 2:
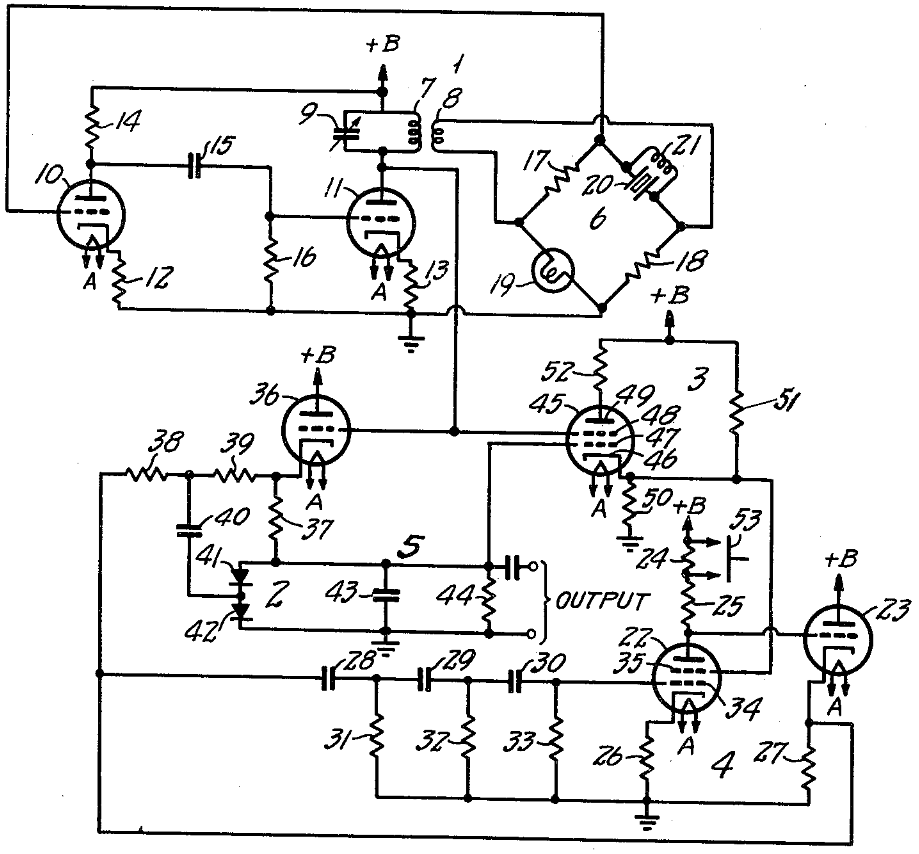
Figure 3:
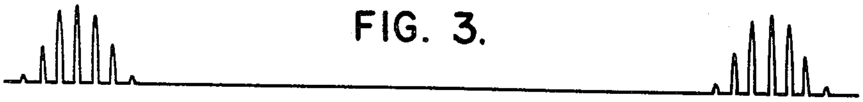

The above and other features of my invention will be better understood from a consideration of the following detailed description taken in conjunction with the accompanying drawings, in which Fig. 1 is a block diagram of a circuit according to my invention;

Fig. 2 is a detailed circuit diagram of the arrangement illustrated in Fig. 1; and Fig. 3 is a waveform diagram which will be referred to in the explanation of the operation of the circuit.

Referring to the block diagram of Fig. 1, an oscillator 1 of high precision provides a frequency of say 100,000 cycles per second to a mixer 2 and to an electronic gate device 3. A second oscillator 4 which may suitably be called a slave oscillator, because the frequency at which it operates is under the control of the precision oscillator 1, also feeds waves to the mixer device 2. Slave oscillator 4 should have a normal frequency which differs from that of the precision oscillator 1 by the desired output frequency, for example, if the desired output frequency is 250 cycles per second, the frequency of the slave oscillator 4 should be 99,750 or 100,250 cycles per second.

The output of the mixer device 2 is passed through a low pass filter 5 to separate the desired difference frequency from the undesired frequencies, this difference frequency being applied to the electronic gate 3 whereby short bursts of pulses or pips at the frequency of the high precision oscillator 1 are applied to the slave oscillator 4 to control automatically its frequency of oscillation. The output at the desired difference frequency may be taken from the low pass filter 5.

Referring now to the detailed circuit of Fig. 2, the circuit illustrated for the high precision oscillator comprises a bridge network 6, a transformer having a primary winding 7 and a secondary winding 8, a resonating capacitor 9, amplifier triodes 10 and 11, with their associated cathode resistors 12 and 13, anode resistor 14, coupling capacitor 15 and grid leak resistor 16. The primary winding 7 of the transformer is connected in the plate circuit of the triode 11 in parallel with the resonating capacitor 9 and the secondary winding 8 is connected across conjugate points of the bridge network 6. The bridge network 6 comprises two resistors 17 and 18, respectively, connected in opposite arms, a temperature or current sensitive resistor, such as a tungsten lamp 19, connected in the third arm, and a quartz crystal 20, which is shunted by an inductor 21 connected in the fourth arm. The inductor 21 has an inductive reactance of opposite sign and equal or approximately equal magnitude to the capacitative reactance of the crystal at the frequency for which the crystal is resonant in its series mode. The operation of this type of oscillator is well known and is described in U.S. Patent 2,163,403 to Meacham.

The slave oscillator 4 is illustrated as one of the phase shift type including an amplifier tetrode tube 22, and a cathode follower tube 23 with associated anode resistors 24 and 25, and cathode resistors 26 and 27, and connected in the feedback path a phase shift network comprising series capacitors 28, 29 and 30, and shunt resistors 31, 32 and 33.

The output frequencies of the high precision oscillator 1 and the slave oscillator 4, are combined in the mixer device 2 which consists of rectifiers 41 and 42 together with interconnecting networks. The output of the high precision oscillator 1 is applied via the cathode follower tube 36 and the output of the slave oscillator is applied over resistors 38 and 39. The junction point of the resistors 38 and 39 is connected via an input capacitor 40 to the junction point of two rectifiers 41 and 42, which are so poled as to apply a negative potential to the low pass filter 5.

In the embodiment shown, the low pass filter 5 comprises a shunt capacitor 43 and a shunt resistor 44. The time constant of this circuit should be such that waves at the frequencies of the two oscillators 1 and 4 are much attenuated, whereas the difference frequency is passed with a little attenuation. The rectifiers 41 and 42, and the associated circuit, operates as a voltage doubling rectifier. During positive half cycles, capacitor 40 is charged via rectifier 42, and during negative half cycles, capacitor 40 is discharged via rectifier 41 into capacitor 43 and resistor 44. Thus a voltage which fluctuates at the difference frequency between zero and a certain negative value will appear at the upper end of the resistor 44.

The electronic gate 3 comprises a tetrode 45 having a cathode 46, a control grid 47, a second grid 48 and an anode 49, and associated cathode resistor 50, bias resistor 51 and anode resistor 52. The positive potential on the second grid 48 is sufficiently high to cause the tube 45 to conduct when a negative bias on the control grid 47 approaches zero.

Because of the positive bias on the cathode 46 of the gating tube 45, derived from resistors 50 and 51 acting as a voltage divider, the tube 45 is cut off except during the positive (least negative) peak of the low frequency cycles applied to the grid 47 from the low pass filter 5, that is, except during a short interval when the voltage at the upper end of the resistor 44 reaches or nearly reaches zero. Therefore, no current will flow through the gate tube 45 most of the time and the current which does flow will consist of a series of short bursts of pulses or pips. There will be produced one such burst for each cycle of the low frequency applied via the low pass filter 5 to the grid 47, and each burst will consist of a number of pulses increasing in amplitude to a maximum and then decreasing to zero, as shown in Fig. 3, the timing of the pulses being precisely controlled by the high precision oscillator 1. The timing of the bursts will be controlled by the difference frequency which, being dependent upon the respective frequencies of the two oscillators 1 and 4, may tend to drift as the slave oscillator 4 tends to drift away from its normal frequency. This tendency to drift will be counteracted by the bursts applied to the second grid 35 of the tetrode 22, bearing in mind that the phase of the pulses is accurately controlled by the high precision oscillator 1. In this manner pulses derived from the high precision oscillator 1 will periodically be added to the slave oscillator 4 and corrections will be periodically applied to pull pulses of the slave oscillator 4 into coincidence with pulses of the high precision oscillator 1 to compensate for the drift which may occur during the time between bursts. A stabilized low frequency output may be taken from the resistor 44 of the low pass filter circuit 5.

Resistor 24 in the plate circuit of the slave oscillator tetrode 32 is arranged to be shunted by a push button switch diagrammatically illustrated at 53. The magnitude of the resistors 24 and 25 should be chosen so that the slave oscillator 4 will readily initiate oscillations when the plate voltage is increased by momentarily closing the switch 53, but when switch 53 is open the amplitude of oscillation will gradually die away in the absence of injected bursts applied to the grid 35 from the gate 3, and will be maintained in the presence of these injected bursts. This ensures that there will be no output in the event of failure of the electronic gate 3 or any other circuit component. Thus the system is "fail safe" by inherent design.

While I have described above the principles of my invention in connection with specific apparatus, it is to be clearly understood that this description is made only by way of example and not as a limitation to the scope of my invention.

What is claimed is:

1. An electric wave generator comprising a source of waves of stable frequency, a slave oscillator operating at a frequency different from said stable frequency, a mixer, means for applying to said mixer waves derived from said source and waves derived from said slave oscillator, means for deriving difference frequency waves from said mixer and means responsive to said difference frequency waves for applying to said slave oscillator bursts of pulses derived from said source, said bursts having the periodicity of said difference frequency waves and said pulses comprising said bursts having the same frequency as the waves of said source.

2. An electric wave generator comprising a source of waves of stable frequency, a slave oscillator operating at a frequency different from said stable frequency, a mixer, means for applying to said mixer waves derived from said slave oscillator together with waves derived from said source of stable frequency, a gating device, means for applying to said gating device waves of said stable frequency, means for deriving from said mixer difference frequency waves, means for applying said difference frequency waves to open said gating device, means for deriving bursts of pulses from said gating device the periodicity of said bursts corresponding to said difference frequency and the pulses having the frequency of said waves of stable frequency, and means for applying said bursts of pulses to said slave oscillator.

3. An electric wave generator comprising a high precision stable oscillator of frequency $f1$, a slave oscillator of frequency $f2$, comprising an electron tube having cathode, anode and control electrodes, a mixer, means for applying waves derived from said stable oscillator and waves derived from said slave oscillator to said mixer, means for deriving difference frequency waves ($f1-f2$ or $f2-f1$) from said mixer, an electronic gating device having an output circuit and first and second control circuits, means for applying waves derived from said stable oscillator to said first control circuit, means for coupling said output circuit to a control electrode of said electron tube and means for applying waves derived from said difference frequency to said second control circuit of said gating device.

4. An electric wave generator comprising a crystal controlled oscillator tuned to oscillate at a first frequency, a slave oscillator comprising an electron tube having an anode, a cathode and a control grid and tuned to oscillate at a second difference frequency, a mixer, means for applying waves derived from said crystal controlled oscillator and said slave oscillator to said mixer, filter means for deriving from said mixer pulses of a frequency equal to the difference frequency between said first and second frequencies, an electronic gating device having an output circuit and first and second control circuits, means for applying waves derived from said crystal controlled oscillator to said first control circuit, means for applying said pulses to said second control circuit, means for deriving from said output circuit bursts of pulses, said bursts having the periodicity of said difference frequency and said pulses comprising said bursts being synchronized with the frequency of said crystal controlled oscillator, and means for applying said bursts of pulses to an electrode of said slave oscillator electron tube.

5. An electric wave generator according to claim 4, wherein said gating device comprises an electron tube having an anode, cathode and two grid electrodes, and said first and second control circuits, respectively, include said two grid electrodes and means for normally biassing said tube to cut-off.

6. An electric wave generator according to claim 4, wherein said slave oscillator comprises an electron tube having an anode, a cathode and two control electrodes and wherein means is provided for adjusting the anode voltage of said last-mentioned tube to a value at which it will cease to oscillate in the absence of injected bursts of pulses applied to one of its control electrodes.

7. An electric wave generator according to claim 6, wherein means is provided for momentarily restoring said anode voltage to a value at which the generation of oscillations is initiated in the absence of injected bursts of pulses.

References Cited in the file of this patent

UNITED STATES PATENTS

| | | |
|---|---|---|
| 1,921,168 | Royden | Aug. 8, 1933 |
| 2,498,760 | Kreithen | Feb. 28, 1950 |
| 2,521,070 | Lindner et al. | Feb. 5, 1950 |
| 2,780,726 | Bladel | Feb. 5, 1957 |